United States Patent [19]
Arakawa et al.

[11] Patent Number: 4,740,752
[45] Date of Patent: Apr. 26, 1988

[54] NON-OVERLAPPING QD MRI RF COIL

[75] Inventors: Mitsuaki Arakawa, Hillsborough; John H. Fehn, El Sobrante, both of Calif.

[73] Assignee: The Regents of the University of California, Berkeley, Calif.

[21] Appl. No.: 893,889

[22] Filed: Aug. 6, 1986

[51] Int. Cl.$^4$ .............................................. G01R 33/20
[52] U.S. Cl. ..................... 324/318; 324/311
[58] Field of Search ............... 324/307, 309, 318, 322, 324/320, 311; 128/653

[56]         References Cited
        U.S. PATENT DOCUMENTS 4,594,566  6/1986  Maudsley .......................... 324/318
4,602,234  7/1986  Butson ............................... 324/320

FOREIGN PATENT DOCUMENTS 2151791  7/1985  United Kingdom ................ 324/307

OTHER PUBLICATIONS

"Quadrature Detection Coils-A Further $\sqrt{2}$ Improvement in Sensitivity" by Chen et al, J. Mag. Res. 54, 324–327 (1983).
"Quadrature Detection in the Laboratory Frame" by Hoult et al, Mag. Res. Med. 1 339–353 (1984).
"A Quadrature Probe for Adult Head NMR Imaging" by Sank et al, Department of Radiology, NIH, pp. 650–651.
"Radio Frequency Penetration Effects in MR Imaging: Simulation/Experiment with Linearly Polarized and Circularly Polarized RF Fields" by Glover et al, GE Medical Systems. pp. 264–265.
"An in vivo NMR Probe Circuit for Improved Sensitivity" by Murphy-Boesch et al, j. Mag. Res. 54, 526–532 (1983).

Primary Examiner—Stewart J. Levy
Assistant Examiner—Kevin D. O'Shea
Attorney, Agent, or Firm—Nixon & Vanderhyde

[57]           ABSTRACT

A quadrature detection magnetic resonance imaging (MRI) RF coil is constructed from non-overlapping axially-extending conductors arrayed about the circumference of a cylinder in four circumferentially spaced-apart groupings. Axially-extending annular gaps in the fingers (e.g, at their mid-points) are bridged across by RF coupling capacitors. The outer ends of the fingers are also coupled by annular conductors having one or more conductive gaps bridged by coupling capacitance. First and second quadrature detection RF input/output ports are coupled to at least one respective finger element in each of two adjacent groups of elements.

12 Claims, 5 Drawing Sheets

NON-OVERLAPPING QD MRI RF COIL

This invention is related to the field of magnetic resonance imaging (MRI) utilizing nuclear magnetic resonance (NMR) phenomena. It is particularly related to an advantageous quadrature-detection (QD) RF coil for such an apparatus.

This application is generally related to earlier filed, commonly assigned, patents and applications of Crooks et al including U.S. Pat. Nos. 4,297,637; 4,318,043; 4,471,305; 4,599,565; the pending application to Crooks Ser. No. 515,116 filed July 19, 1983 (now U.S. Pat. No. 4,607,225); the pending application to Arakawa et al Ser. No. 827,609 filed Feb. 10, 1986 (now allowed); the pending application to Harrison et al Ser. No. 827,638 filed Feb. 10, 1986 (now U.S. Pat. No. 4,682,125); and the copending applications to Arakawa et al Ser. No. 888,074 and Fehn et al Ser. No. 878,369 filed June 25, 1986 (now allowed).

Magnetic resonance imaging (MRI) is now coming into wide-spread commercial usage. Nevertheless, there are still many possible areas for improvement. For example, desired improvements are still sought to improve the signal-to-noise ratio in NMR responses and, accordingly, in resulting NMR images.

One previously known technique for improving the attainable signal-to-noise ratio involves the use of quadrature RF transmit/receive coils. For example, a general description of such quadrature RF coils and of the potential benefits to be derived from use of same is provided in the following prior publications:

"Quadrature Detection Coils—A Further Improvement in Sensitivity" by Chen et al, J. Mag. Res. 54. 324–327 (1983)

"Quadrature Detection in the Laboratory Frame" by Hoult et al, Mag. Res. Med. 1 339–353 (1984)

"A Quadrature Probe For Adult Head NMR Imaging" by Sank et al, Department of Radiology, NIH, pp 650–651

"Radio Frequency Penetration Effects in MR Imaging: Simulation/Experiment with Linearly Polarized and Circularly Polarized RF Fields" by Glover et al, GE Medical Systems, pp 264–265.

(The above-referenced Arakawa et al and Fehn et al applications also specificatlly relate to quadrature RF coils for MRI.)

These prior publications describe, for example, a pair of matched quadrature RF coils wherein each coil includes four axially extending legs disposed at 60°, 120°, 60° and 120° intervals about a common cylinder—with one coil being rotated 90° spatially with respect to the other. The quadrature phase outputs from these two separate coils are subsequently combined in a 90° hybrid so as to produce an output having increased signal-to-noise ratio (e.g., because the non-coherent noise will tend to cancel when the two signals are coherently added with an appropriate 90° phase shift in one of them). As is also noted in these references, one or both of the coils may be advantageously utilized for transmitting RF NMR excitation pulses into the enclosed volume to be imaged so as to further enhance the attainable signal-to-noise ratio and/or so as to reduce the required level of transmitted RF power.

Ideally, there should be no inductive and/or capacitive coupling between the two RF quadrature coils. In reality, there is always inherently some spurious coupling. In part, such undesirable coupling between prior QD coil structures is enhanced because portions of the two coils must necessarily overlap in closely adjacent spacing when wrapped about a common cylinder. In reality, the two separate coil structures cannot be precisely located within a common layer—but rather, must partially overlap one another. Nevertheless, the effective isolation between the two coils can be improved by purposefully adding some additional coupling between the coils of the proper amplitude and phase to cancel (or at least substantially reduce) the unwanted but inherent spurious inter-coil coupling. It is apparently for this purpose that the prior art has employed conductive areas (termed "paddles") between some sections of the coil legs.

Although the general theory of quadrature detection coils is known in the prior art, the successful realization of a commercially reproducible working embodiment of such a system with minimum coupling between the coils, an RF balanced coil structure—and one which is nevertheless configured spatially in a manner which facilitates not only manufacture but actual use—remains as a difficult task.

Some prior approaches have employed coil structures having both ends of the coil structure open-ended with axially extending feedlines emanating from opposite ends of the overall structure and respectively associated with each of the two coils.

Some of the earlier-referenced related applications disclose improved quadrature detection magnetic resonance imaging (MRI) RF coil structures which permit center feeding arrangements. Nevertheless, these structures have typically employed separate conductive structures which necessarily overlap one another when they are located about the circumference of a common cylinder. Although insulating tape or other forms of insulation may be used to maintain conductive isolation between the two separate but overlapping coil structures, this arrangement necessarily produces unwanted inductive and/or capacitive coupling between the two coil structures which are supposed to be completely isolated from one another. Even though such unwanted coupling can be largely cancelled by additional tuned capacitive coupling between portions of the coil having signals of opposite polarity, it does increase the need and criticality for such further cancellation coupling.

Furthermore, when overlapping coil structures are involved, this necessarily complicates the detailed mechanical structure of the coil as well as its manufacture.

We have now discovered that it is possible to obtain a quadrature detection (QD) magnetic resonance imaging (MRI) radio frequency (RF) coil using but a single (i.e., non-overlapping) layer of conductive elements arranged about a volume to be imaged. The conductors are preferably arranged in four spaced-apart groups and interconnected by coupling capacitances with first and second quadrature detection RF ports being coupled to respective conductors in adjacent ones of the groups.

By arranging all of the conductive elements in a single non-overlapping layer, the physical structure and manufacture of the coil is simplified. At the same time, unwanted and/or sometimes unpredictable RF coupling between the overlapped portions of the coils is eliminated (albeit a separately adjustable cancellation capacitance is still preferably utilized to maximize RF isolation of the two quadrature detection RF input/output ports).

In the exemplary embodiment, the conductive portion of the entire coil structure may be simply realized by two axially spaced-apart annular members lying about the circumference of the common cylinder. Each of these members includes a plurality of axially-extending fingers located in four circumferentially spaced-apart groups. The ends of the fingers of each element are respectively aligned and opposingly situated across a small annular gap region. Most, if not all, of such gaps are bridged across by RF coupling capacitors. Each element preferably also includes a small axially-extended gap in its circumference which is bridged across by RF coupling capacitors. Such breaks in conductivity, together with bridging RF coupling capacitances, tend to reduce eddy currents otherwise induced into the structure at audio frequencies due to pulsating magnetic gradient fields present within typical magnetic resonance imaging system.

A first RF port is coupled to at least one finger pair of a first group of the fingers while a second RF port is coupled to at least one finger pair of a second (e.g., adjacent) group. In the exemplary embodiment, such RF port coupling may include a variable parallel tuning capacitance connected across the gap between a pair of mated fingers and a series coupling capacitance connected to a standard RF transmission line (e.g., coaxial cable). In the preferred exemplary embodiment, the RF transmission line also includes an RF trap circuit of the type described more completely in the above-referenced related application to Harrison et al (sometimes called a "ground breaker").

Viewed from a different perspective, the exemplary non-overlapping QD MRI RF coil of this invention includes a three dimensional structure of conductive elements arranged about a volume to be imaged in a single non-overlapping layer and having opposing portions interconnected by RF coupling capacitances. A first RF port is coupled to a first section of such a structure and provides RF signals having a first relative phase from within the volume while a second RF port coupled to a second section of the structure provides RF signals having a second relative phase (which is approximately 90° with respect to the first relative phase). In the exemplary embodiment, the RF coupling ports are also spatially offset with respect to one another by approximately 90°.

As previously mentioned, the conductive elements of such a three dimensional structure may collectively define a cylindrically-shaped structure generally described as having first and second annular bands which are axially spaced from one another. Each of the bands includes axially extending fingers emanating toward the other band and the fingers are aligned in mating opposition across a small annular gap area (which is bridged by coupling capacitances). Each of the major annular members may also include one or more gaps in conductivity bridged by RF coupling capacitances.

This circumferential array of fingers is preferably disposed into four circumferentially spaced-apart groups (i.e., interspersed with four extended window areas). Quadrature detection ports are then coupled to adjacent ones of these groups. Typically, a parallel tuning capacitance may be connected across the annular gap area between a predetermined pair of opposing fingers within each such group with series coupling capacitance and RF transmission lines then being respectively connected also across the gap at essentially the same area so as to provide RF input/output ports having a quadrature phase relationship. Isolation capacitance (typical variable) is also preferably connected between different points on the two annular structures having approximately oppositely phased signals.

These as well as other objects and advantages of this invention will be more completely appreicated and understood by carefully studying the following detailed description of a presently preferred exemplary embodiment of this invention in conjunction with the accompanying drawing, of which:

Figure 4:
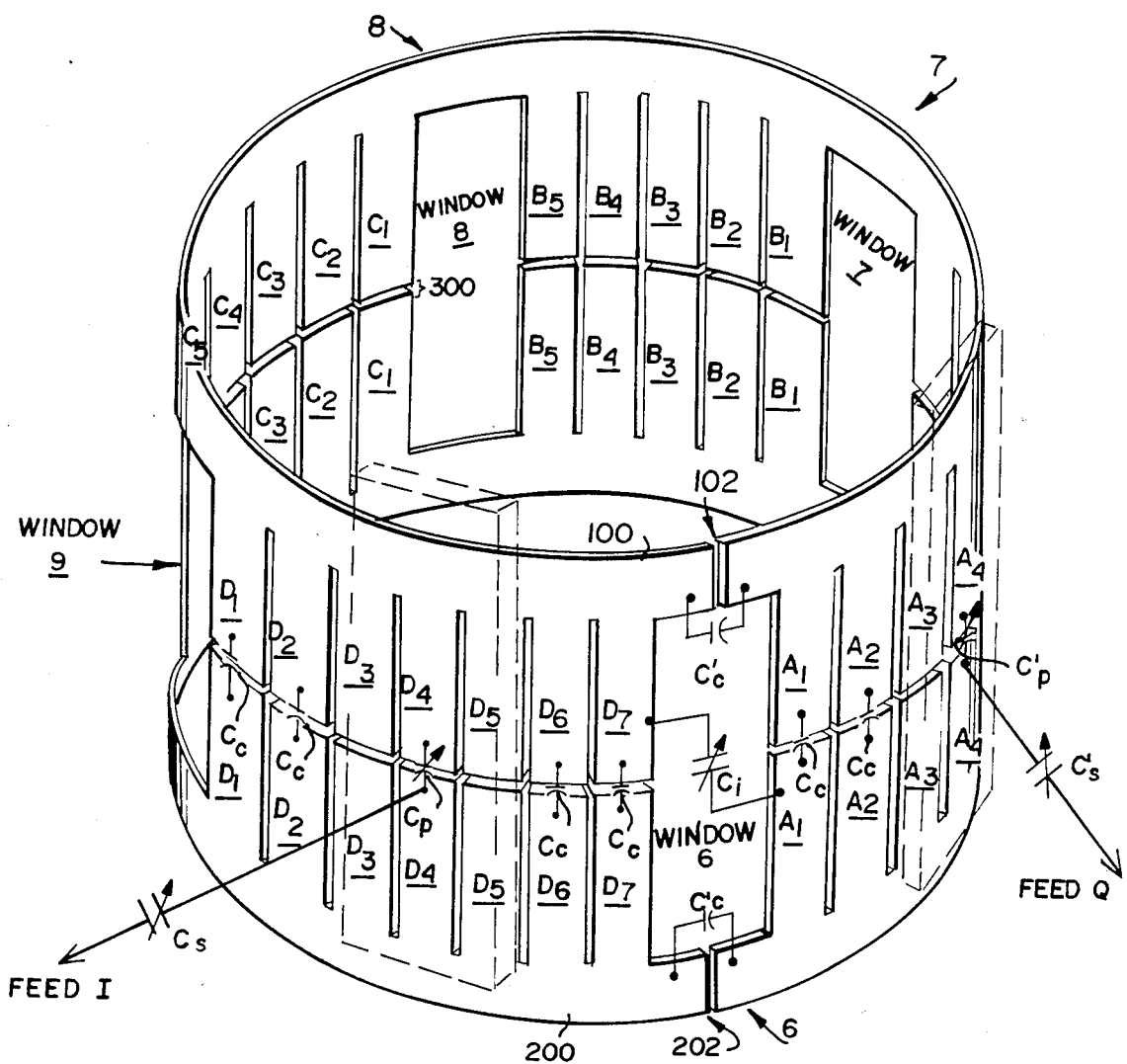
FIG. 4 is an overall perspective view of the two annular conductive elements used in the exemplary embodiment with various capacitive elements also being indicated in schematic form (so as not to obscure the structure of the annular conductive elements)
Figure 6:
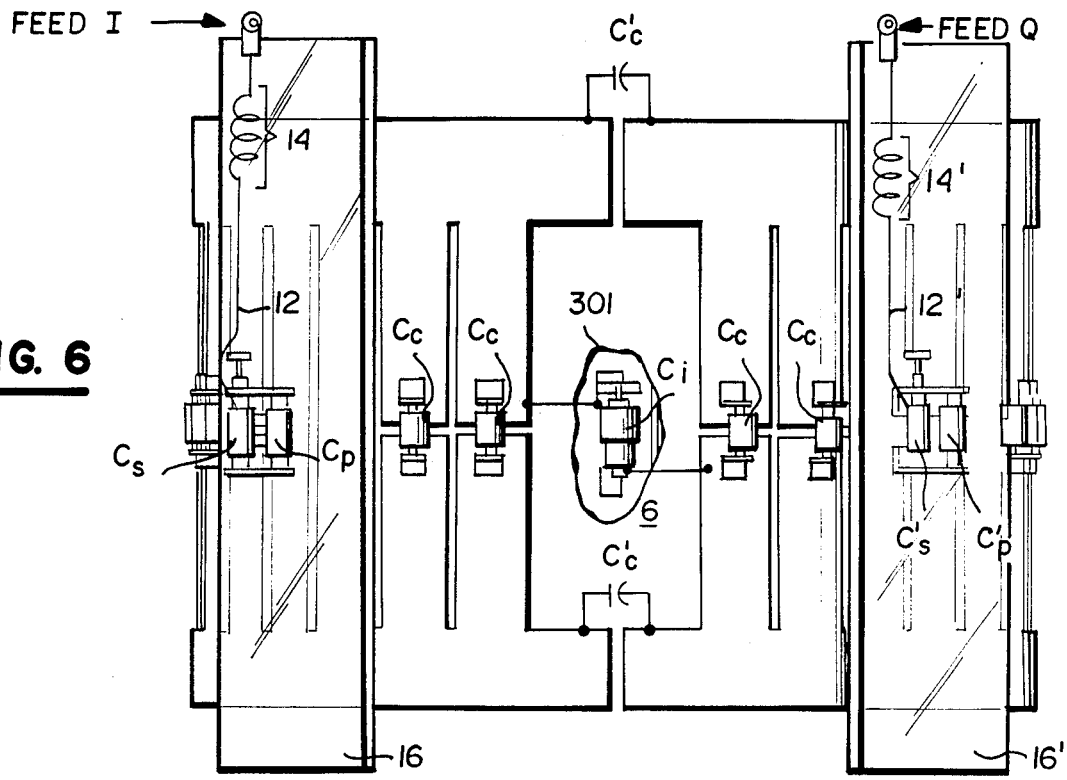
FIG. 6 is a elevation view of the structure shown in FIG. 4 taken in the direction of window six and illustrating the manner in which coupling capacitors, RF input/output tuning capacitance and other elements are located.
Figure 7:
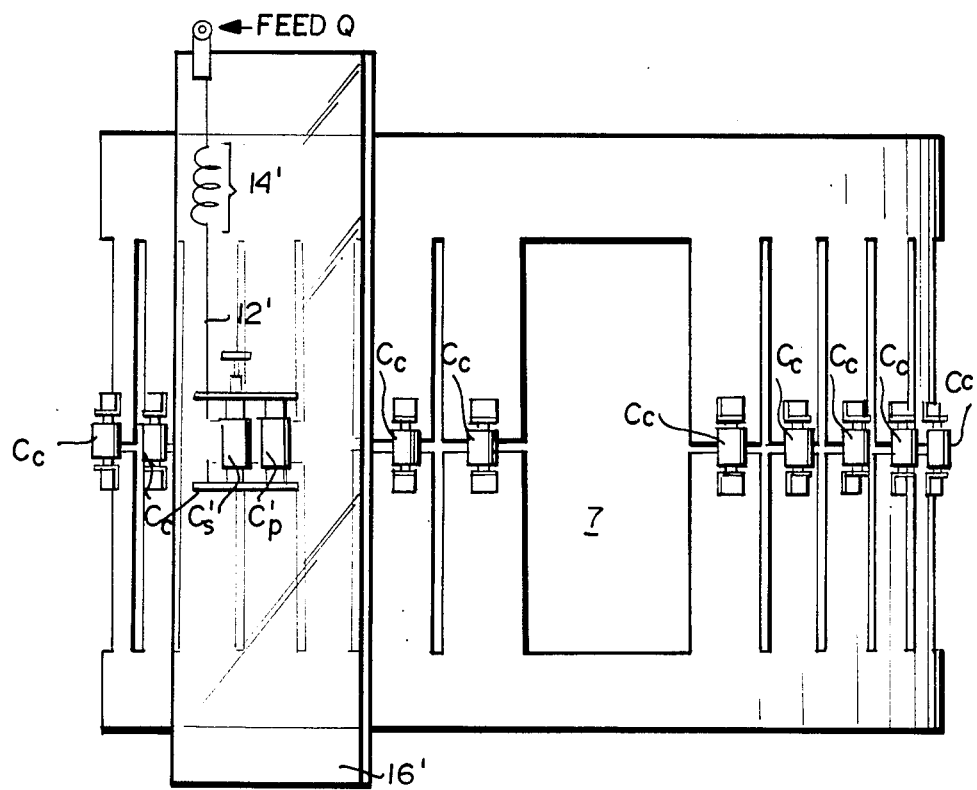
Figure 8:
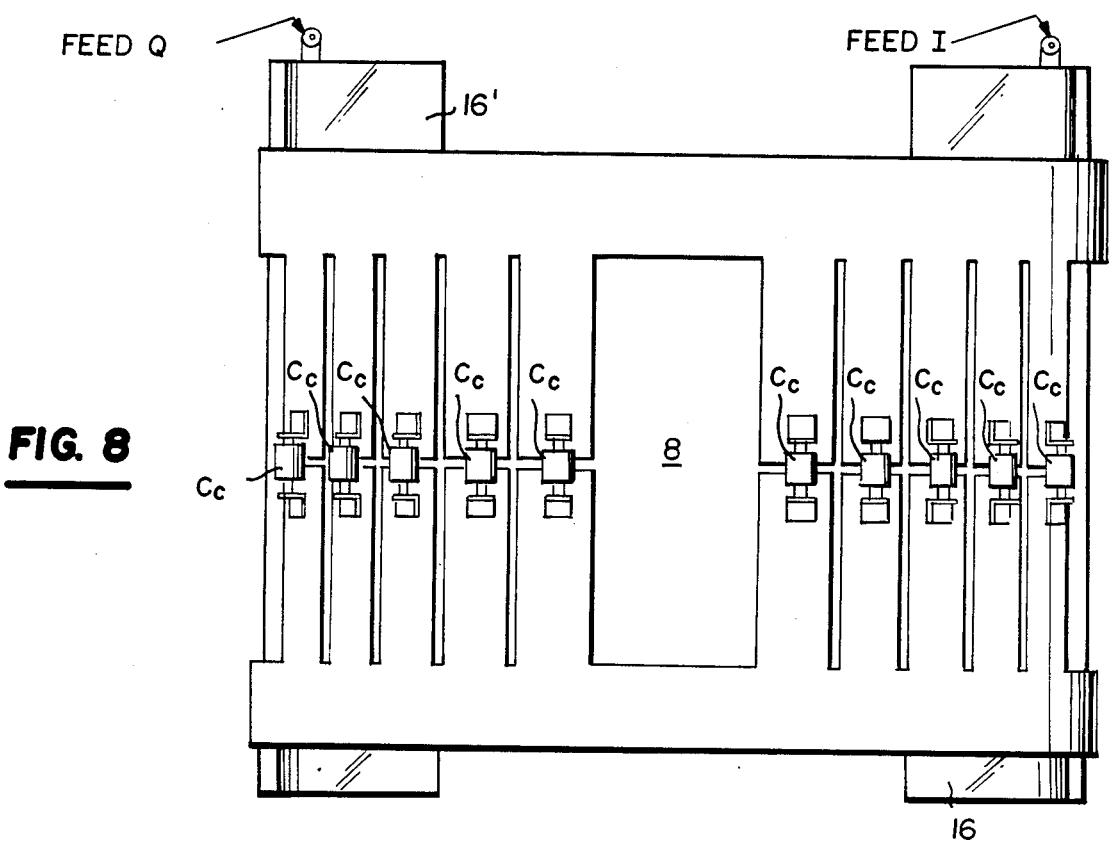
Figure 9:
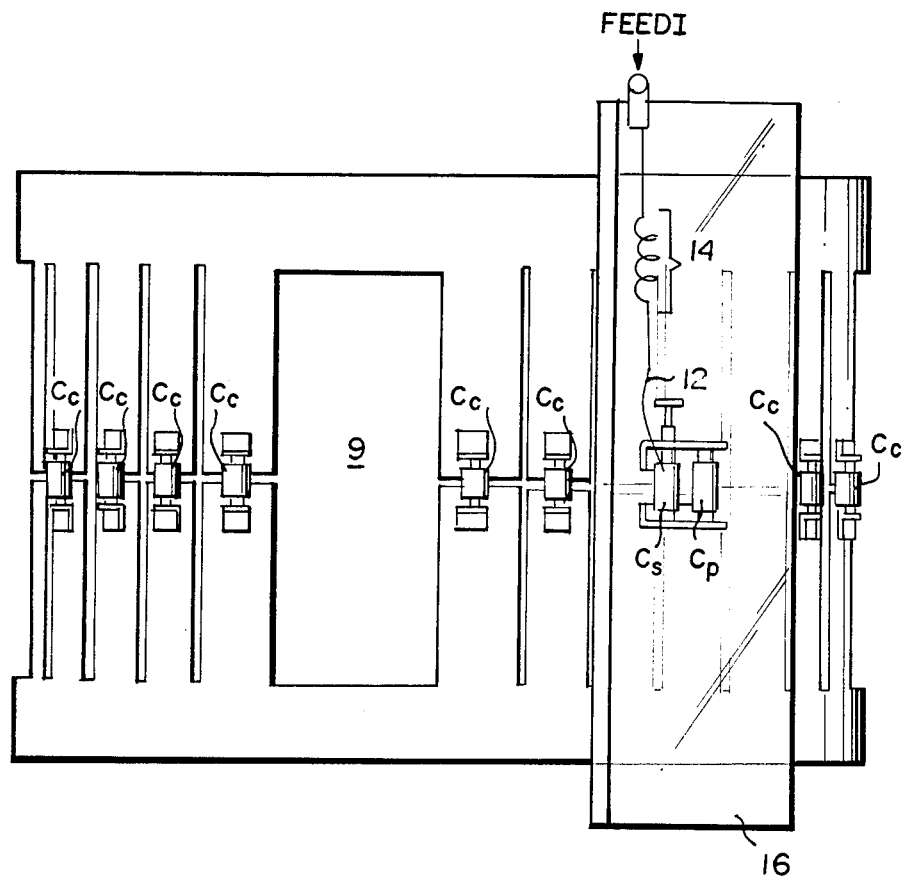
Figure 10:
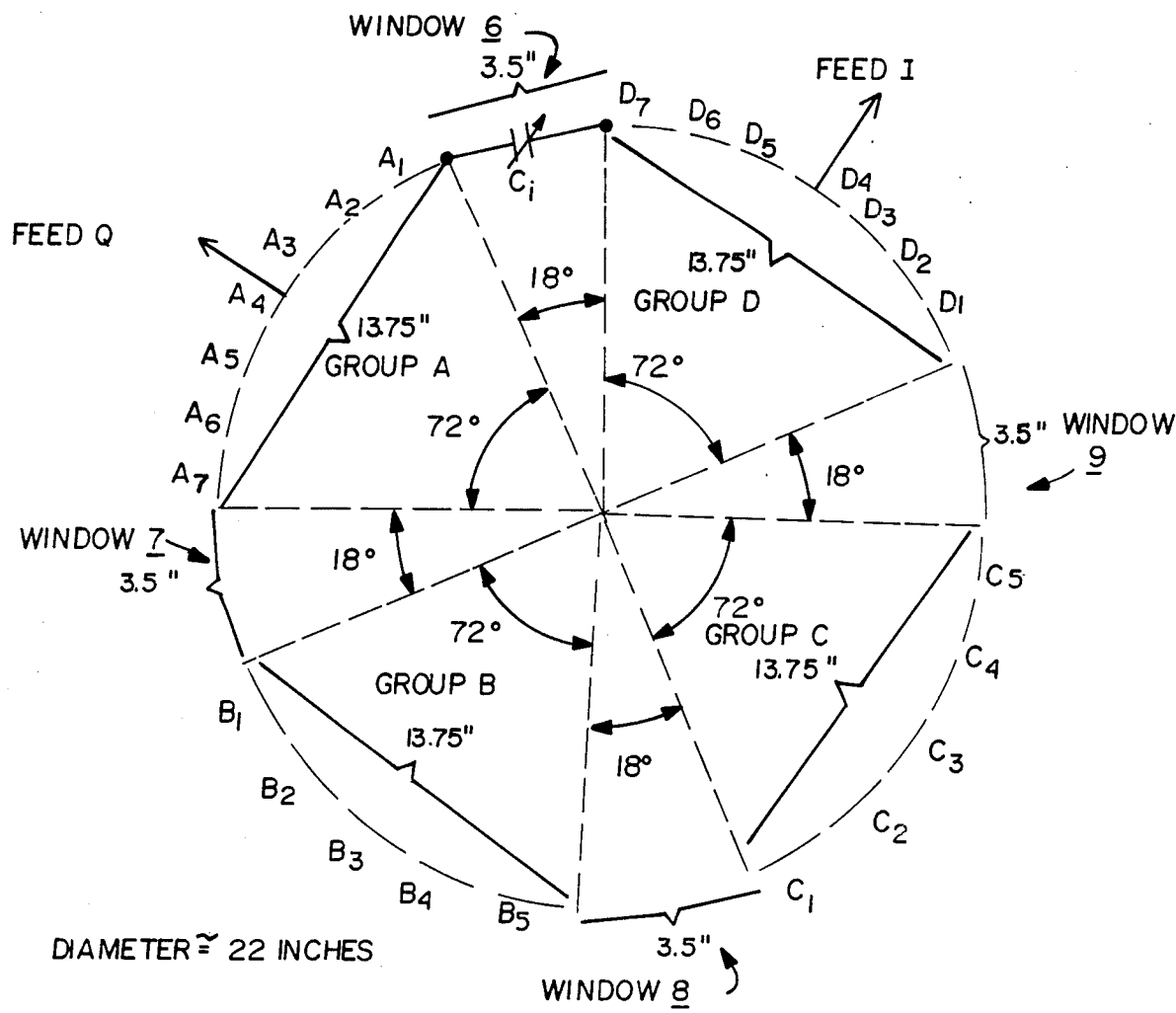

FIGS. 7, 8 and 9 are similar to FIG. 6 but taken in the direction of windows 7, 8 and 9 respectively; and FIG. 10 is a schematic plan view of a cross-section of the conductive structure depicted in FIG. 4 so as to better illustrate the dimensions and angles subtended by the different groups of conductive elements in the exemplary embodiment.

Figure 1:
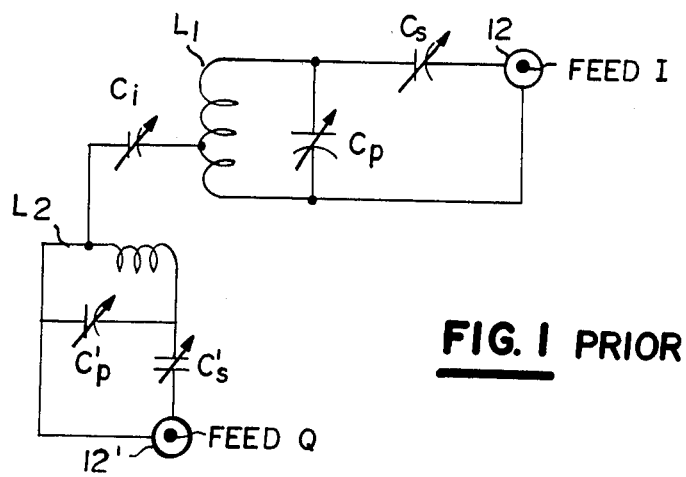
FIG. 1 is a schematic electrical diagram of an equivalent circuit for the quadrature detection MRI radio frequency coil of this invention.

FIG. 1 depicts a conventional schematic circuit diagram for a quadrature detection MRI RF coil arrangement. In general, such QD MRI RF coils comprise first and second inductors L1, L2 spatially disposed at 90° with one another and connected by respective parallel ($C_p$ and $C'_p$) and series ($C_s$ and $C'_s$) tuning capacitances to standard RF transmission line structures (12 and 12') so as to provide two independent RF input/output ports (feed I and feed Q) having RF phase relationships that are in quadrature (i.e., 90° with respect to one another). Typically, because of inherent spurious coupling between the two coils L1 and L2, the two coils are interconnected at points of approximately opposite polarity with a tuning cancellation capacitance $C_i$ so as to further enhance RF isolation between the two coil structures.

Although achieved with a considerably different physical structure (as described with respect to the remaining figures), this invention is intended to provide a resultant system having an equivalent electrical circuit substantially the same as that depicted in FIG. 1 for prior art structures.

Figure 2:
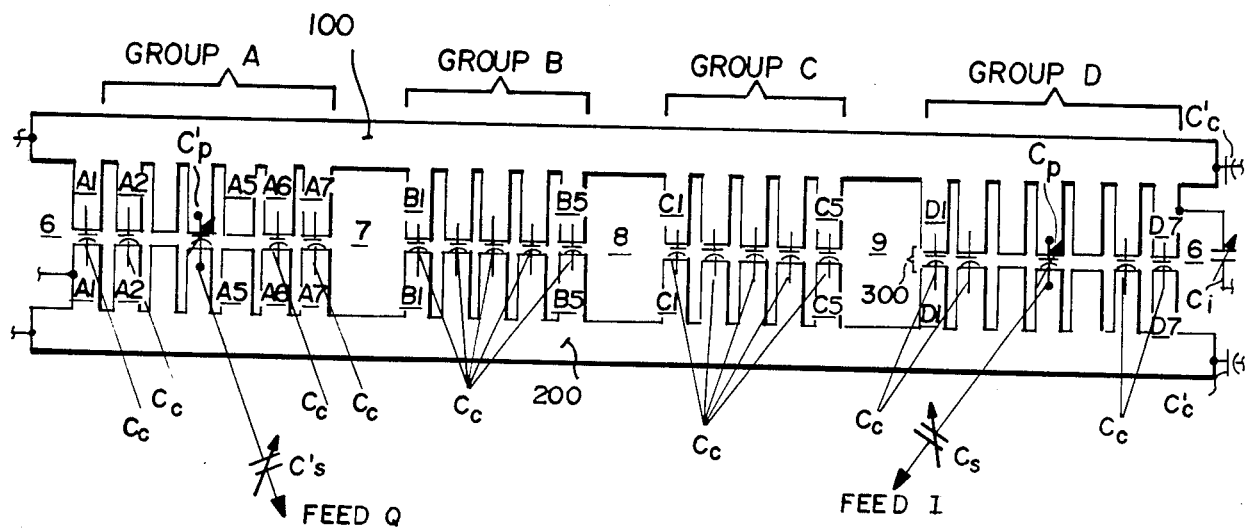
FIG. 2 is a schematic depiction of the two annular conductive elements used in the exemplary embodiment where the elements have been "flattened out" into a plane for illustrative purposes.
Figure 3:
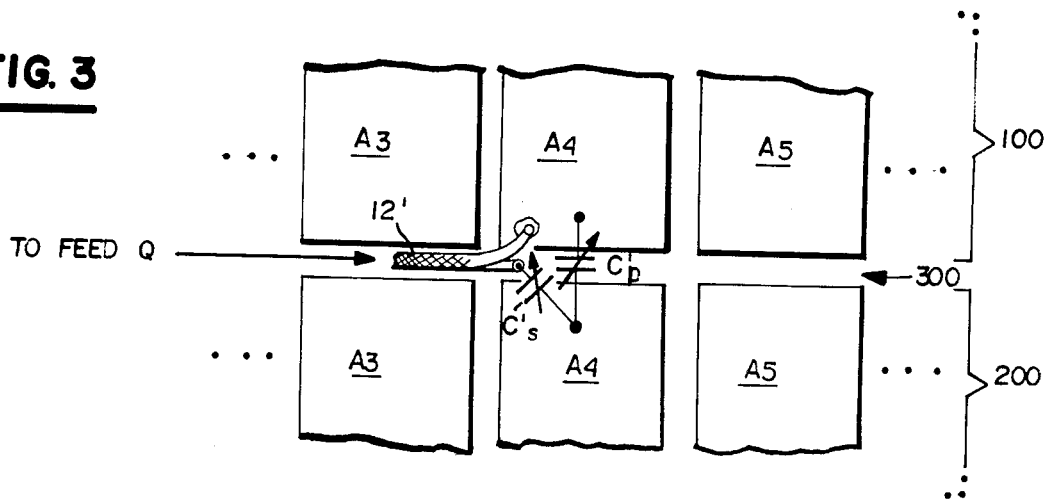
FIG. 3 is an enlarged depiction of a portion of FIG. 2 so as to better illustrate the manner in which RF input/output ports are coupled to the finger structures.
Figure 5:
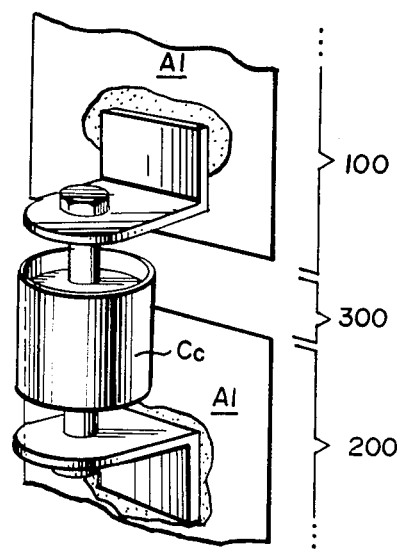
FIG. 5 is a fragmentary perspective view of two mating fingers and an associated RF coupling capacitance $C_c$.

As shown in FIGS. 2-4, the exemplary embodiment may be formed of two conductive structures 100 and 200. (As those in the art will appreciate, these structures might be further subdivided and intereconnected by coupling capacitances, if desired.) Structures 100 and 200 are preferably wrapped circumferentially about a common cylinder and axially spaced-apart by an annular gap 300. As best seen in FIG. 4, the ends of the conductive structures 100, 200 also define small axially-extending circumferential gaps in conductivity 102 and 202. Most of these gaps in conductivity 300 are bridged by coupling capacitances $C_c$ (e.g., 100 picofarads) (as decpicted schematically at FIGS. 1 and 4 and as depicted structurally in FIG. 5). Gaps 102 and 202 are also capacitively bridged for RF coupling by capacitances $C'_c$.

As can also be seen in FIGS. 2-4, annular conductive-elements 100 and 200 include axially extending fingers separated into four groups A, B, C and D. For example, group A includes seven fingers A1 ... A7, Group B includes five fingers B1 ... B5, Group C includes five fingers C1 ... C5 and Group D includes seven fingers D1 ... D7. These axially extended fingers are opposingly aligned with one another as depicted in the FIGURES and, except for the center three fingers of Groups A and B, the axial gap 300 between the fingers is bridged by coupling capacitance $C_c$. As previously mentioned, gaps 102 and 202 are also bridged by coupling capacitances $C'_c$. The four groups of finger elements A-D are effectively defined by being spaced-apart and interspersed with windows 6, 7, 8 and 9.

RF input/output connections for the quadrature detection ports are, in the exemplary embodiment, made at the center of adjacent groups A and D (which, in the exemplary embodiment, are also spatially disposed at 90°). For example, as depicted in the enlarged representation of FIG. 3, a parallel tuning capacitance $C'_p$ may be connected to the opposing finger elements A4. Quadrature RF feed Q is then made via standard coaxial transmission line 12' which has its shield conductor connected to finger A4 of conductive element 100 while its center conductor is connected via series tuning capacitance $C_s$ to finger A4 of conductive element 200. Similar RF port connections would be made to finger elements D4 to provide a quadrature detection input/output port I. In the exemplary embodiment, no coupling capacitance is connected across fingers A3 and A5 due to limited physical space considerations. However, as those in the art will appreciate, such coupling capacitance can be included if desired.

As also depicted in the figures, an isolation capacitor $C_i$ is connected between predetermined points on finger D7 of conductive element 100 and finger A1 of conductive element 200 so as to further enhance the effective RF isolation between the quadrature detection ports I and Q. If the whole assembly is mounted on a dielectric cylinder 301 (see FIG. 6), then capacitor $C_i$ may be simply mounted on the surface of the form 301 at window 6.

As depicted in the elevation views of FIGS. 6-9, each of the RF transmission lines 12, 12' preferably includes a "ground breaker" section 14, 14' respectively (as described in more detail in the copending application of Harrison et al). In addition, plastic or other types of mounting plates 16, 16' may be physically mounted outside the conductive elements for location of the parallel and series tuning capacitors as well as transmission lines, ground breaker segments and RF connectors, etc.

In the cross-sectional plan view of FIG. 10, dimensions are provided for an exemplary embodiment. As should be appreciated, these dimensions can be altered for different system requirements.

While only one exemplary embodiment has been described in detail, those skilled in the art will recognize that many variations and modifications may be made in this embodiment while yet retaining many of the novel features and advantages of this invention. Accordingly, all such variations and modifications are to be included within the scope of the appended claims.

What is claimed is:

1. A quadrature detection MRI RF coil comprising:
   a single layer of conductors arranged about a volume to be imaged, said conductors being arrayed in four spaced-apart groups and said conductors being interconnected by coupling capacitances;
   spacing between said groups being greater than spacing between conductors within a group;
   a first RF port coupled to at least one conductor in a first of said groups and having a first RF phasing; and
   a second RF port coupled to at least one conductor in a second of said groups and having a second RF phasing which is approximately 90° relative to said first RF phasing.

2. A quadrature detection MRI RF coil comprising:
   a first conductive element having a plurality of axially extending fingers arrayed about the circumference of a cylinder, said fingers being located in four circumferentially spaced-apart groups, the spacing between groups being greater than spacing between the fingers within a group;
   a second conductive element also having a plurality of axially extending fingers arrayed about the circumference of said cylinder and being axially-spaced from and circumferentially aligned with the fingers of said first conductive element;
   a plurality of RF coupling capacitances interconnecting said first and second elements;
   a first RF port coupled to at least one finger of a first group of said fingers and having a first RF phasing; and
   a second RF port coupled at least one finger of a second group of said fingers and having a second RF phasing which is approximately 90° relative to said first RF phasing.

3. A non-overlapping quadrature detection magnetic resonance imaging RF coil comprising:
   a three-dimensional structure of conductive elements arranged about a volume to be imaged in a single non-overlapping layer and including opposing portions thereof interconnected by RF coupling capacitances;
   a first RF port coupled to a first predetermined section of said structure for providing RF signals having a first relative phase from within said volume; and
   a second RF port coupled to a second predetermined section of said structure for providing RF signals having a second relative phase, approximately 90° with respect to said first relative phase, from within said volume.

4. A quadrature detection magnetic resonance imaging RF coil as in claim 1, 2 or 3 wherein said first RF port and said second RF port are coupled to said structure at points spatially offset with respect to one another by approximately 90°.

5. A non-overlapping quadrature detection magnetic resonance imaging RF coil as in claim 3 wherein said structure of conductive elements collectively define a cylindrically-shaped structure comprising:
   first and second annular bands axially spaced from one another;

a first plurality of axially extending fingers emanating from the first band toward said second band;

a second plurality of axially extending fingers emanating from the second band toward said first band and disposed to matingly oppose said first fingers across a predetermined annular gap area;

coupling capacitors connected across the gap area between corresponding pairs of said first and second fingers;

said fingers being circumferentially disposed into four spaced-apart groups interspersed with four extended window areas;

a first parallel tuning capacitance connected across the gap area between a predetermined pair of fingers within a first group of fingers;

a second parallel tuning capacitance connected across the gap area between a predetermined pair of fingers within a second group of fingers, said second group being one of those groups disposed adjacent said first group; and wherein:

said first RF port includes at least a first series coupling capacitor and a first RF transmission line connected across the gap between a predetermined pair of fingers within said first group, and said second RF port includes at least a second series coupling capacitor and a second RF transmission line connected across the gap between a predetermined pair of fingers within said second group.

6. A non-overlapping quadrature detection magnetic resonance imaging RF coil as in claim 5 wherein each of said first and second annular bands include an axially extending slot therethrough and an RF coupling capacitor bridgingly connected thereacross.

7. A non-overlapping quadrature detection magnetic resonance imaging RF coil as in claim 6 further comprising;

an isolation capacitor connected between fingers located in two different ones of said groups.

8. A quadrature detection mangetic resonance imaging RF coil comprising:

an array of axially-extending conductive fingers disposed as four separated groups about the circumference of a common cylinder and including gaps in conductivity which are bridged by RF coupling capacitance;

first and second annular conductive bands circumferentially interconnecting said fingers at axially spaced-apart locations which encompass said gaps;

said annular bands each including at least one axially-extending gap in conductivity which is bridged by RF coupling capacitance;

first parallel and series coupling capacitance connected with a first transmission line across the circumferential gap in at least one finger within a first of said groups and providing an RF in/out port of a first relative phase; and second parallel and series coupling capacitance connected with a second transmission line across the circumferential gap in at least one finger within a second of said groups and providing an RF in/out port of a second relative phase which is in quadrature with said first phase.

9. A quadrature detection magnetic resonance imaging RF coil as in claim 8 wherein:

said first and second groups are adjacently located ones of said four groups.

10. A quadrature detection magnetic resonance imaging RF coil as in claim 9 further comprising:

an isolation capacitor connected beteeen legs located in two different ones of said groups.

11. A quadrature detection magnetic resonance imaging RF coil as in claim 10 wherein each of said groups subtends an angle of approximately 70 degrees.

12. A quadrature detection mangetic resonance imaging RF coil as in claim 11 wherein the diameter of said cylinder is approximately 22 inches.

* * * * *